United States Patent
Vajana et al.

[11] Patent Number: 5,850,360
[45] Date of Patent: Dec. 15, 1998

[54] HIGH-VOLTAGE N-CHANNEL MOS TRANSISTOR AND ASSOCIATED MANUFACTURING PROCESS

[75] Inventors: Bruno Vajana, Bergamo; Livio Baldi, Agrate Brianza, both of Italy

[73] Assignee: SGS-Thomson Microelectronics, S.r.l., Agrate Brianza, Italy

[21] Appl. No.: 607,779

[22] Filed: Feb. 27, 1996

[30] Foreign Application Priority Data

Feb. 28, 1995 [EP] European Pat. Off. .............. 95830065

[51] Int. Cl.⁶ .................................................. G11C 11/34
[52] U.S. Cl. ......................... 365/181; 365/156; 257/371; 257/336; 257/339
[58] Field of Search ................................... 365/181, 156; 257/371, 339, 336, 369

[56] References Cited

U.S. PATENT DOCUMENTS

| | | | |
|---|---|---|---|
| 4,697,332 | 10/1987 | Joy et al. | 257/371 |
| 5,321,287 | 6/1994 | Uemura et al. | 257/371 X |
| 5,512,769 | 4/1996 | Yamamoto | 257/339 |
| 5,568,418 | 10/1996 | Crisenza et al. | 385/185.01 |

FOREIGN PATENT DOCUMENTS

| | | |
|---|---|---|
| 0 538 054 | 4/1993 | European Pat. Off. . |
| 58-170047 | 10/1983 | Japan . |
| 59-215766 | 12/1984 | Japan . |
| 61-174667 | 8/1986 | Japan . |
| 1276663 | 11/1989 | Japan . |
| WO 85/05736 | 12/1985 | WIPO . |

*Primary Examiner*—David Nelms
*Assistant Examiner*—Huan Hoang
*Attorney, Agent, or Firm*—Davaid V. Carlson; Bryan A. Santarelli; Seed and Berry LLP

[57] ABSTRACT

A CMOS device and process are disclosed in which two types of N-channel MOS transistors are provided, one being formed in a P-well and one being formed outside the P-well where the relatively low doping concentration of P-type substrate serves as a channel defining region. This second type N-channel transistor an support higher junction voltages due to the lower p-type doping concentration than is possible for the first type N-channel transistor formed in the higher doping concentration P-well. A mask is provided to prevent boron doping in the substrate at the site of the high voltage transistor during the implantation step which defines the P-well.

10 Claims, 2 Drawing Sheets

HIGH-VOLTAGE N-CHANNEL MOS TRANSISTOR AND ASSOCIATED MANUFACTURING PROCESS

BACKGROUND OF THE INVENTION

1. Field of the Invention

The present invention relates to a high-voltage N-channel MOS transistor and a CMOS process for manufacturing it.

2. Description of the Related Prior Art

The field of application of the invention concerns in particular non-volatile electronic memory devices such as EPROM, EEPROM and FLASH EEPROM integrated on a substrate of semiconductor material with CMOS technology and the description given below refers to a high-voltage N-channel MOS transistor manufactured by a CMOS process.

As known, circuits integrated on a substrate of semiconductor material by means of a CMOS-type technology must be capable of operating even when they are subjected to voltages much higher than their supply voltage.

To meet this requirement, there are provided in these integrated circuits N-channel MOS transistors having an architecture capable of operating correctly even when the transistors are subjected to relatively high voltages.

It is noted that in general high-voltage N-channel MOS transistors are obtained by means of CMOS-type processes with N-well or with twin-well provided on a substrate of semiconductor material having type P conductivity.

In N-well CMOS-type processes these transistors are provided in such a manner as to obtain two peculiarities.

The first peculiarity is obtained by providing the high-voltage transistors with source and drain junctions with so-called gradual doping.

This means that the junctions are provided in such a manner that the concentration of dopant increases gradually while shifting from the edge of the gate region of the transistors towards the contacts of the source and drain regions.

There are obtained in this manner source and drain junctions with high breakdown voltages. The second peculiarity is obtained by providing the gate oxide of the high voltage transistors much thicker, about 50%, than standard.

This ensures that the high voltage transistors have a gate oxide which, due to its greater thickness, is capable of withstanding voltages much higher than the supply voltage of the integrated circuits in which they are included.

In N-well CMOS-type processes these high voltage transistors are widely used and allow meeting the requirements of the majority of high voltage applications.

In twin-well CMOS-type processes in which in the substrate having type-P conductivity are present wells both with P-type conductivity in which are obtained the high-voltage N-channel MOS transistors and N-type conductivity wells, there arise problems in manufacturing the above mentioned transistors.

In these processes formation in the substrate by means of implantation and subsequent diffusion of the type-P wells causes an increase in the dopant concentration.

This increase in the dopant concentration causes the breakdown voltage of the source and drain junctions of the high voltage transistors to drop considerably.

Consequently these transistors are not capable of providing the performance desired.

SUMMARY OF THE INVENTION

It an object of the present invention to provide two types of N-channel MOS transistors in a CMOS device wherein one such type has a relatively high performance in terms of breakdown voltage of its source and drain junctions. This is accomplished without making complex and costly changes to its manufacturing process.

The solution idea underlying the present invention is to add a masking to the twin-well CMOS process for manufacturing N-channel MOS transistors to protect from subsequent implantation a portion of substrate in which the transistor is to be provided.

The preferred embodiment of the invention is implemented in a CMOS memory device integrated on a substrate of a first conductivity type. A first transistor having source and drain regions is formed in a first portion of the substrate such that the substrate defines PN junctions with the source and drain regions of this first transistor. A second transistor of the same polarity of the first transistor is formed in a first well of the first conductivity type. The first well has a higher doping concentration than the substrate and defines PN junctions with the source and drain regions of the second transistor, thereby causing the first transistor to have a higher voltage breakdown capability than the second transistor. A third transistor of the opposite polarity from the first and second transistors is provided in a second well of the second conductivity type.

The features and advantages of the transistor according to the present invention will become apparent from the following description of an embodiment thereof, given by way of example and not limitation with reference to the accompanying drawings.

DETAILED DESCRIPTION OF THE PREFERRED EMBODIMENT

The figures of the accompanying drawings generally and schematically illustrate a high-voltage N-channel MOS transistor 1 embodying this invention.

It is noted that the structure of the transistor 1 is now described with reference to the steps of the process leading to its production.

For fabrication of the transistor 1 is used a substrate 2 of semiconductor material, e.g. silicon, having a first type of conductivity and in particular type P and a resistivity which typically varies from 1 to 3 ohms per cm.

Figure 1:
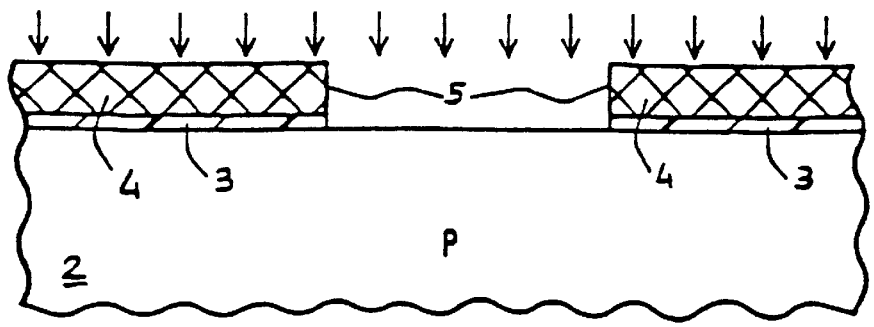
FIGS. 1 to 8 show in enlarged scale and vertical cross section a substrate of semiconductor material on which are performed in succession the process steps for manufacture the device in accordance with the present invention.

As shown in FIG. 1, on the substrate 2 is formed an oxide layer 3 on which is deposited a nitride layer 4.

These two layers are then selectively etched to open on the substrate 2 through which window 5 at which is performed an implantation of phosphorous in a dose of about $10^{12}$ to $10^{13}$ cm$^{-2}$.

Figure 2:
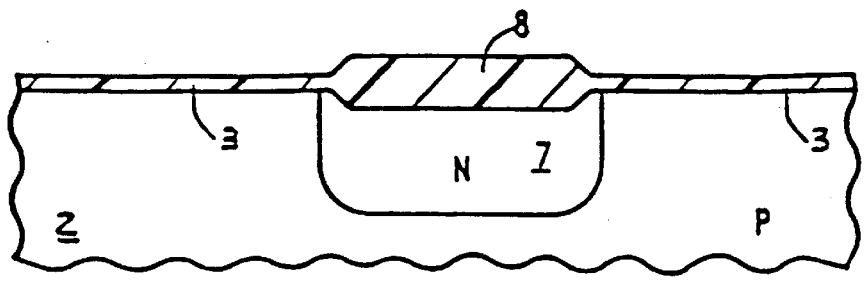

Next the phosphorous is made to diffuse through the substrate 2 to form a well 7 as shown in FIG. 2 and having a second type of conductivity and in particular type N and a depth of about 3.5 mm.

As shown in FIG. 2, during the heat treatment for diffusion of the phosphorous is formed on the substrate 2 an area 8 of thick oxide in the window 5.

Next the nitride layer 4 is completely removed.

Figure 3:
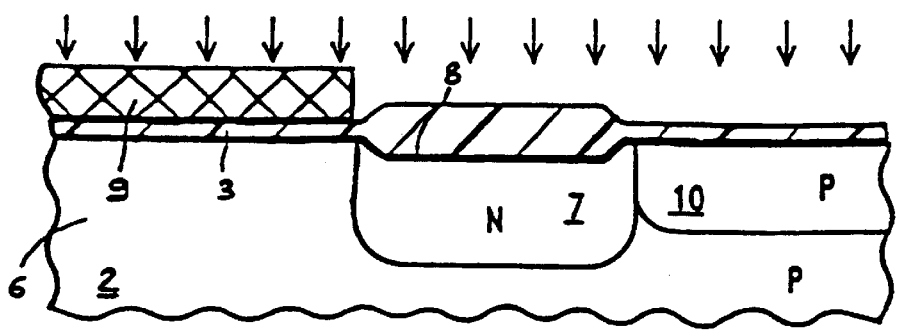

As shown in FIG. 3 there is then provided a masking 9 for protection of a portion 6 of the substrate 2 in which will be realized the transistor 1.

Specifically the masking 9 of a thickness between 1 and 1.5 mm is obtained by depositing a photoresist film over the oxide layer 3 at the portion 6 of the substrate 2.

Then in the substrate 2 is implanted boron in a dose of about $10^{12}$ to $10^{13}$ cm$^{-2}$.

It is important to note that the thick oxide area 8 and the masking 9 prevent penetration of the boron in the well 7 with N-type conductivity and in the portion 6 of the substrate 2.

As show in FIG. 3 the boron is made to diffuse through the substrate 2 to form a well 10 aligned with the well 7 and having a first type of conductivity and in particular type P and a depth of about 1.5 mm.

The masking 9, the oxide layer 3 and the thick oxide area 8 are then completely removed.

The following steps of the manufacturing process of the transistor 1 lead in a known manner to definition of the active areas of the transistor.

Figure 4:
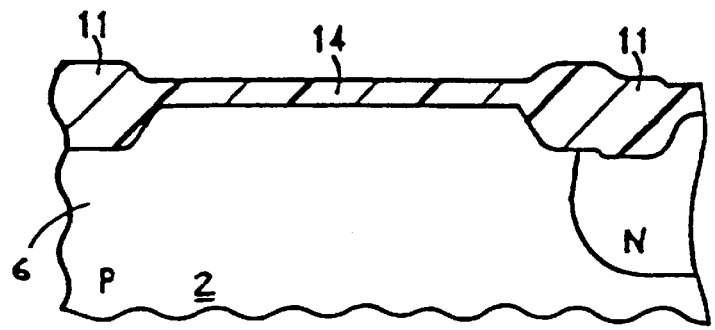

This implies formation on the substrate 2 of thick field oxide areas 11 with a thickness of about 6000 to 7000 Angstroms, (FIG. 4).

Then a thin oxide layer 14 with a thickness of about 250 to 350 Angstroms is grown on the surface of the substrate 2 between the thick field oxide areas 11, as shown in FIG. 4.

This thin oxide layer 14 will form the gate oxide of the transistor 1.

Figure 5:
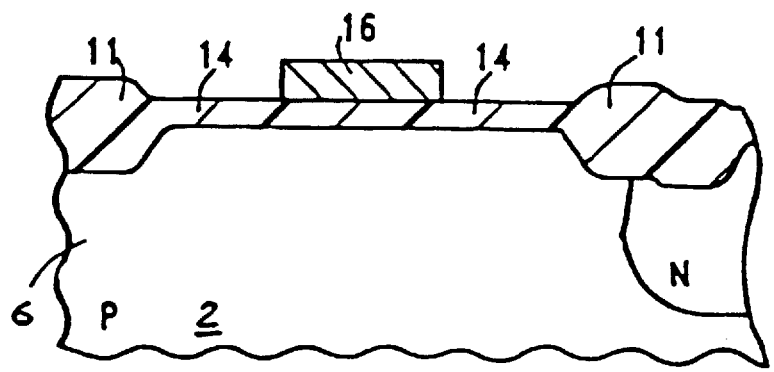

Next on the surface of the substrate is deposited a polysilicon layer which, after being doped with type N impurities, is selectively etched to form the gate region 16 of the transistor 1, as shown in FIG. 5.

Then phosphorous is implanted in the substrate 2 in a low dose ($10^{12}$ to $10^{13}$ cm$^{-2}$) to form at the sides of the channel region 18 lightly doped source and drain regions 20.

Figure 6:
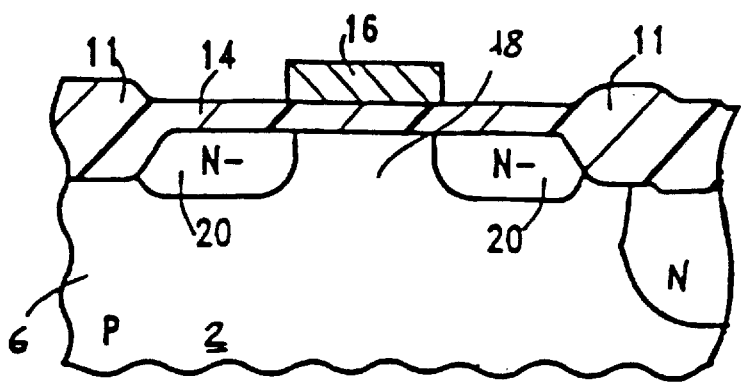

These source and drain regions 20 have a second type of conductivity and in particular type N and having a depth of about 0.3 mm, as shown in FIG. 6.

Figure 7:
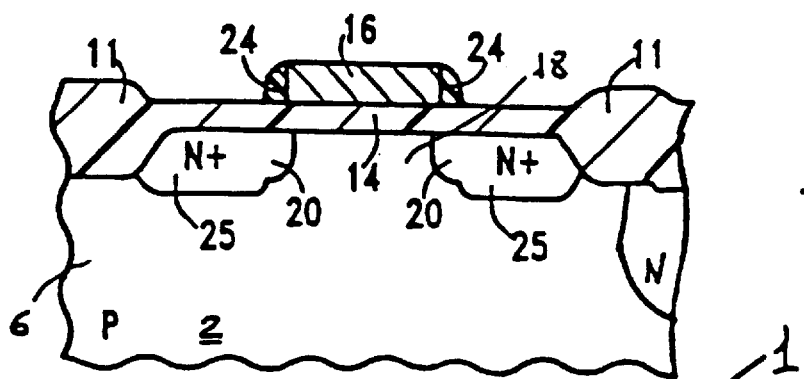

Around the edges of the gate region 16 are then formed in a known manner so-called oxide spacers 24, (FIG. 7).

A high dose ($10^{15}$ to $10^{16}$ cm$^{-2}$) of arsenic is selectively implanted in the lightly doped source and drain regions 20 to form heavily doped source and drain regions 25 having a second type of conductivity and in particular type N+, as show in FIG. 7.

Figure 8:
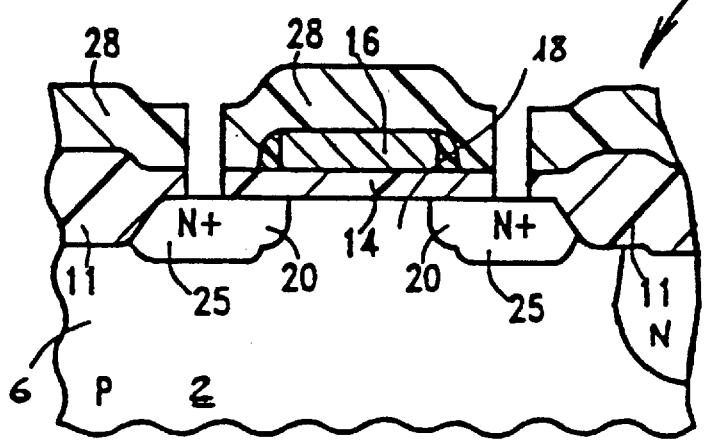

With reference to FIG. 8 an insulating material layer 28 is then deposited on the surface of the substrate 2.

This insulating material layer 28 is then selectively removed together with portions of the oxide layer 14 to open contact windows to the heavily doped source and drain regions 25.

The manufacturing process for the transistor 1 proceeds then in a conventional manner with the definition of the metal interconnections and with the deposition of a passivating material on the substrate surface.

In conclusion, the addition of the masking 9 in the manufacturing process of the high-voltage N-channel MOS transistor allows keeping unchanged the original doping of the substrate 2 in the portion 6 of the substrate in which the transistor is to be provided.

In this manner the performance in terms of break-down voltage of the source and drain junctions of the transistor is significantly improved.

For example, in a CMOS type process with twin-well for manufacturing non-volatile EEPROM memories with a single polysilicon, the breakdown voltage of the source and drain junctions of the high-voltage n-channel MOS transistors increases considerably, i.e. from about 16.5 V to about 19 V.

What is claimed is:

1. A CMOS memory device integrated on a substrate of semiconductor material having a first conductivity type, comprising:
    a first transistor having source and drain regions formed in a first portion of the substrate, the substrate defining junctions with said source and drain regions;
    a first well, having the first conductivity type, included in a second portion of the substrate to permit forming source and drain regions of a second transistor, said first well having a doping concentration greater than the doping concentration of the substrate and defining junctions with the source and the drain regions formed therein, wherein the first transistor can support a higher junction voltage than the second transistor;
    a second well, having a second conductivity type, included in a third portion of the substrate, to permit forming a third transistor therein of an opposite polarity from the first and second transistors; and
    wherein the source and drain regions of the first transistor comprise shallow, lightly doped portions and deep, heavily doped portions and wherein the shallow, lightly doped portions define edges of a channel of said first transistor.

2. The CMOS memory device of claim 1, wherein the second well is interposed between the first well and the site of the first transistor.

3. The CMOS memory device of claim 2, wherein the first and the second wells are self-aligned.

4. The CMOS memory device of claim 3, wherein the second well is deeper than the first well.

5. The CMOS memory device of claim 4, wherein said first conductivity type is P and said second conductivity type is N.

6. The CMOS memory device of claim 4, wherein the first and the second transistors are N-channel MOS transistors, and wherein the third transistor is a P-channel MOS transistor.

7. The CMOS memory device of claim 1, wherein the first transistor comprises a polysilicon gate formed over the surface of the substrate and having edges aligned with the shallow, lightly doped portions of the source and drain regions.

8. The CMOS memory device of claim 7, wherein the first transistor comprises first and second spacers formed around the edges of the polysilicon gate.

9. A CMOS memory device integrated on a substrate of semiconductor material having a first conductivity type, comprising,
    a first transistor having source and drain regions formed in a first portion of the substrate, the substrate defining junctions with said source and drain regions;
    a first well, having the first conductivity type, included in a second portion of the substrate to permit forming source and drain regions of a second transistor, said first well having a doping concentration greater than the doping concentration of the substrate and defining junctions with the source and the drain regions formed therein, wherein the first transistor can support a higher junction voltage than the second transistor;
    a second well, having a second conductivity type, included in a third portion of the substrate, to permit forming a third transistor therein of an opposite polarity from the first and second transistors; and
    wherein the first and second transistors each comprise a respective gate insulator, the gate insulator of the first transistor being significantly thicker than the gate insulator of the second transistor.

10. A CMOS memory device integrated on a substrate of semiconductor material having a first conductivity type, comprising:

a first transistor having source and drain regions formed in a first portion of the substrate, the substrate defining junctions with said source and drain regions;

a first well, having the first conductivity type, included in a second portion of the substrate to permit forming source and drain regions of a second transistor, said first well having a doping concentration greater than the doping concentration of the substrate and defining junctions with the source and the drain regions formed therein, wherein the first transistor can support a higher junction voltage than the second transistor;

a second well, having a second conductivity type, included in a third portion of the substrate, to permit forming a third transistor therein of an opposite polarity from the first and second transistors; and wherein the first transistor comprises a channel region that is disposed between the source and drain regions, at least one of the source and drain regions having a doping concentration that increases in a direction away from the channel region.

\* \* \* \* \*